(12) United States Patent
Andle (10) Patent No.: US 6,825,715 B2
(45) Date of Patent: Nov. 30, 2004

(54) TEMPERATURE COMPENSATED, HIGH EFFICIENCY DIODE DETECTOR

(75) Inventor: Jeffrey C. Andle, Brewer, ME (US)

(73) Assignee: Biode, Inc., Westbrook, ME (US)

( * ) Notice: Subject to any disclaimer, the term of this patent is extended or adjusted under 35 U.S.C. 154(b) by 41 days.

(21) Appl. No.: 10/429,151

(22) Filed: May 2, 2003

(65) Prior Publication Data

US 2004/0217807 A1 Nov. 4, 2004

(51) Int. Cl.⁷ .............................. H03G 3/20; H03D 1/10
(52) U.S. Cl. ..................... 329/370; 329/366; 327/332
(58) Field of Search ....................... 329/370; 330/129, 330/140, 143, 289; 455/126; 327/332

(56) References Cited

U.S. PATENT DOCUMENTS

| | | |
|---|---|---|
| 4,000,472 A | 12/1976 | Eastland et al. |
| 4,490,681 A | 12/1984 | Turner |
| 4,502,015 A | 2/1985 | Nicholas et al. |
| 4,791,380 A | 12/1988 | Chiappetta |
| 4,820,995 A | 4/1989 | Tamura |
| 5,060,298 A | 10/1991 | Waugh et al. |
| 5,987,312 A | 11/1999 | Dekker |
| 6,084,920 A | 7/2000 | Ferdinandsen |
| 6,262,630 B1 * | 7/2001 | Eriksson ..................... 330/129 |

OTHER PUBLICATIONS

"A Suppressed Harmonic Power Detector for Dual Band Phones", Alan Rixon and Raymond Waugh, Applied Microwave & Wireless, Nov. 1999, pp. 62–68 (Noble Press).
"Schottky Diode Voltage Doubler, Application Note 956–4" Hewlett Packard Co., Palo Alto CA, 1995.

* cited by examiner

Primary Examiner—Michael B Shingleton
(74) Attorney, Agent, or Firm—Shalom Wertsberger; Saltamar Innovations (57) ABSTRACT

A diode detector comprising a detector network adapted to detect and multiply the detected voltage coupled to a divider network that comprise diodes in equal number to the number of diodes in the detector network, provides a passive detector applicable to any application requiring a small, efficient, high output, inexpensive temperature compensated detector for use as demodulator or as power to voltage converter.

53 Claims, 5 Drawing Sheets

Fig. 1

PRIOR ART

Fig. 2

PRIOR ART

TEMPERATURE COMPENSATED, HIGH EFFICIENCY DIODE DETECTOR

FIELD OF THE INVENTION

This invention relates to diode detector circuits and more particularly to a passive, temperature compensated high efficiency diode detector

BACKGROUND OF THE INVENTION

Figure 1:
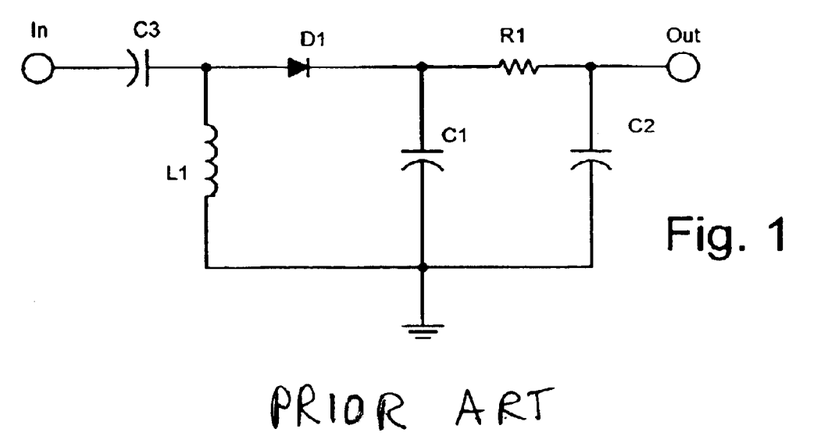
FIG. 1 depicts a basic diode detector as known.

Diode detectors had been known in the art from the first days of radio. They are used to demodulate radio frequency (RF) or any other alternating current (AC) signal and turn it into voltage representative of the modulating waveform. A common diode detector is shown in FIG. 1. AC, sonic, sub sonic, ultra sonic or RF energy and the like (commonly referred to as RF hereinafter) is rectified by diode D1 that acts as a non-linear element for the conversion. While a Schottky diode is preferred, alternative asymmetric junctions are also suitable. The rectified signal is integrated by the capacitor C1 which also serves as the ground return path for the RF signal.

Additional components are frequently included to improve functionality. By way of example, inductor L1 may be employed to provide electrical matching. Resistor R1 and capacitor C2 offer a low pass filter for additional integration time and improved signal to noise ratio. Capacitor C3 is frequently employed to decouple the incoming RF from DC voltages in the circuit.

Those skilled in the art have long recognized that the diode detector may be used to generate voltage that is representative of the AC power inserted into the detector circuit. A typical diode detector circuit as shown in FIG. 1 has a wide frequency response, and a reasonably low conversion loss in the order of six or seven dB.

Figure 2:
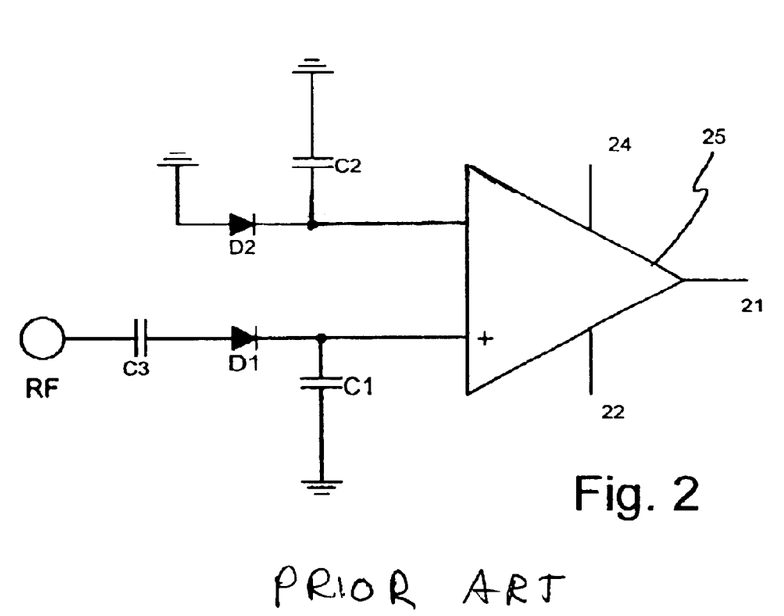
FIG. 2 depicts a temperature compensated diode detector which relies on a differential amplifier for its operation

The circuit however, suffers from poor thermal stability. Several solutions are known in the art to improve stability over a wide temperature range, and are based generally on placing a pair of matching diodes in a the same ambient environment, exposing only one to the RF signal (a detector diode), and utilizing the other (a compensation diode) to cancel or minimize the effects of temperature on the first. An example of such circuit may be seen in FIG. 2, which utilizes a differential amplifier to reduce effects of the thermal characteristics of the diodes. Differential amplifier 25 amplifies the difference between the signal induced in each of the diodes and thus compensate for temperature drift. While the circuit of FIG. 2 offers temperature compensation, the cost, size, weight, and power requirements of the differential amplifier are prohibitive for many applications. The need for positive 24 and negative 22 power supplies further complicates circuit design, and is in stark contrast to the passive nature of the circuit of FIG. 1. Furthermore, the differential amplifiers typically have restricted operating temperature range, whereas the passive components operate over much larger temperature extremes. Thus there are distinct advantages for a detector circuit that does not require a differential amplifier.

Another example of a temperature compensated envelope detector is found in U.S. Pat. No. 4,000,472 to Eastland et al. Eastland teaches a voltage doubler envelope detector, with a forward bias applied to the detector input to shift detector operation out of the nonlinear square law region of operation. The temperature compensation is achieved by having a signal path extending through the envelope detector to one input of a differential amplifier, and having a similar reference path using similar diodes extending to the other input of the same differential amplifier. The difference voltage between the two paths is relatively less affected by temperature variations.

In U.S. Pat. No. 4,820,995 Tamura teaches an envelope detector comprising of passive elements. Essentially, the Tamura system provides a voltage divider, with a series leg having one diode, and an equivalent or similar parallel leg having a second diode. The detector output is from the junction between the legs. As similar DC current flows through both diodes, they exhibit very similar dynamic resistance, and thus one diode compensates for the temperature variability of the other, and the detector has good temperature stability. However, the Tamura circuit suffers a major drawback: Due to the voltage divider, the circuit provides only one half of the voltage provided by a single diode, non-compensated detector. This reduces the signal to noise ratio of the detector by about 6 dB.

In U.S. Pat. No. 6,262,630, Eriksson describes another temperature compensated diode detector. Eriksson provides for a detector diode and a compensation diode in series, and connects an output buffer at the output of the detector diode. As the Eriksson system is also based on a voltage divider, it suffers from a 50% (6 dB) decrease in detection efficiency over the single diode detector, which like the Tamura circuit translates into lower dynamic range and lower signal to noise ratio.

Figure 3:
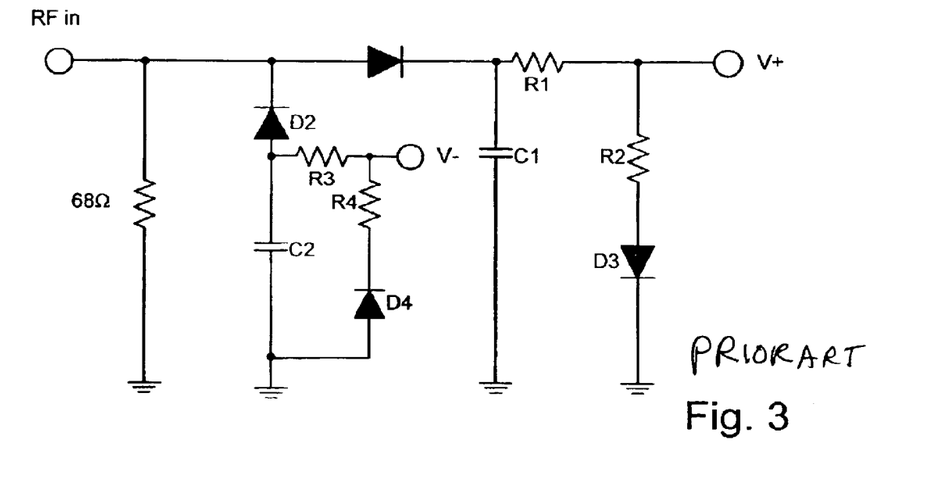
FIG. 3 depicts a temperature compensated, differential diode detector circuit, adapted to suppress second harmonic detection, and to produce a differential output.

In "A Suppressed Harmonic Power Detector for Dual Band Phones", (Alan Rixon and Raymond Waugh, APPLIED MICROWAVE & WIRELESS, November 1999, pp. 62–68 (Noble Press)) Rixon et al provide another temperature compensated detector, as seen in FIG. 3. The circuit is designed towards suppressing the second harmonic of the detected signal. When measured with a differential amplifier the Waugh circuit provides good temperature stability but again suffers from the disadvantages of low efficiency and the use of a differential amplifier entails all the liabilities mentioned above.

Voltage multipliers are well known in the art. One may envision the voltage multiplier as a network in which by an arrangement of diodes a plurality of capacitors are connected in parallel to be charged, and connected in series to be discharged, thus effectively doubling the input voltage.

The numerous attempts described above as well as many others point to a clear, and heretofore unfulfilled need in the industry for a high efficiency, temperature stable, envelope detector. The present invention aims to provide such a detector.

SUMMARY OF THE INVENTION

It is therefore an aim of the invention to provide a high efficiency temperature compensated envelope detector circuit. Preferably, the circuit will require only passive components such as capacitors, resistors and diodes. Those skilled in the art will recognize that the output of the detector may be coupled to any number of active components such as amplifiers, transistors, and the like, but that the configuration disclosed herein provide a high efficiency, temperature compensated, demodulated output corresponding to the incoming signal, requiring only passive components.

The ideal detector will provide sufficient signal to noise ratio (determined by the conversion efficiency) to allow the user to place the detector remotely from the active components while maintaining signal integrity. This allows passive detection of electrical signals in a harsh environment.

Therefore it is an aspect of the present invention to provide a temperature compensated diode detector comprising a detector network and a divider network, each having an equal number of diodes therein, wherein the detector network is adapted to be coupled to an input signal and is operative to detect a voltage commensurating with said input signal and to multiply said detected voltage to produce a multiplied voltage, and wherein said divider network is coupled to said multiplied voltage and is operative to reduce said multiplied voltage. One may view the temperature compensation achieved, by reducing the multiplied voltage in a temperature dependent manner, preferably directly due to changes in the dynamic impedance of the diodes in the divider network, which corresponds to the change in dynamic impedance of the diodes in the detector network. Therefore, it is preferable that the detector network and the divider network each has substantially equal temperature dependent dynamic impedance characteristics.

Also preferably, the detector network and the divider network are coupled in series, and an output is taken from a junction therebetween. More preferably, the divider divides said multiplied voltage by a pre-determined factor, preferably of 2 or an approximation thereof.

It is also an aspect of the present invention to provide a diode detector comprising an input terminal adapted to receive an input signal, and an output terminal for outputting a detected voltage commensurating with said input signal, a detector network comprising a detector diode, coupled to said input signal for producing a detected voltage, and an integrating reactance (such as a capacitor for a series detector and an inductor for a shunt detector), and a voltage multiplier circuit comprising at least one multiplier diode. The voltage multiplier is coupled to the detected voltage and produces multiplied voltage. A divider network comprising a plurality of diodes equaling in number to the number of diodes in the detector network, is coupled to the multiplier so as to divide the multiplied voltage by a pre-determined divider factor of 2, or an approximate thereof. Preferably, the detector diode is integrated within the voltage multiplier.

Most preferably, both the detector network and the divider network are embedded within a single integrated circuit, however in a preferred embodiment all diodes in both networks are implemented on a single substrate or in a single package using die that were adjacent on the source wafer. This will provide the best possible matching of the diodes temperature coefficients, which is highly desirable.

In the preferred embodiment of the invention, the detector network and the divider network each have a resistive element embedded therein. In one embodiment, the resistive elements comprise FET transistors wired to operate as resistors.

In a preferred embodiment, the detector network comprises a multiplier diode having a circuit ground coupled cathode. The detector diode cathode is coupled to the anode of said multiplier diode. An integrating capacitor is coupled between the anode of the detector diode and circuit ground. An injecting capacitor, also acting as a part of the voltage multiplier, couples the AC input signal to the cathode of said detecting diode. A plurality of multiplier and detector diode pairs may be placed in series creating an m-diode detector with a conversion efficiency m-fold higher than that of a single diode. The multiplier produces multiplied voltage with relation to the input signal. The divider network comprises of similar number of series connected diodes (m) to the number of series connected diodes in the detector network, and is coupled to the multiplied voltage preferably via the integrating capacitor. As such the divider network provides an equal dynamic impedance component, and acts as a voltage divider to divide the voltage multiplier output by a factor of 2 or an approximate thereof. The combined circuit has an approximate conversion efficiency of m/2 and is temperature compensated. Most preferably, all diodes in the detector network and the divider network form a single series circuit branch with all diodes having the same polarity within the branch. It should be noted that the polarity of the diodes as described and shown is given by way of example only. Those skilled in the art will recognize that the circuit will operate in a similar fashion if all the polarities described above are reversed, and thus a similar circuit with inverted diode polarities is equivalent to the circuit shown, and that claims to one circuit extend to the opposite polarity circuit.

In another embodiment, said diode arrangement is biased by a fixed current flowing through the 2m series-connected diodes. Preferably, the circuit is arranged such that all diodes in the detector, multiplier and divider segments form a single series circuit branch, causing all of the diodes to share a common bias current.

It is yet another aspect of the present invention to provide a method for producing an output voltage commensurating with an alternating current input signal, the method comprising the steps of coupling an input signal into at least one detector diode and integrating capacitor to produce detected voltage, multiplying said detected voltage using a voltage multiplier having at least one multiplier diode to produce multiplied voltage, and dividing said multiplied voltage using a divider network comprising a number of diodes equal to the sum of diodes used in said step of detecting and said step of multiplying. Preferably the divider network divides multiplied voltage by a factor of 2 or an approximate thereof.

The invention is usable in many applications including when embedded within any integrated circuit, for bolometers, as demodulators in radio devices, and most specifically in digital radio or in Automatic Gain Control (AGC) or Automatic Level Control (ALC) circuits that are specially sensitive when used for Quadrature Amplitude Modulation (QAM). Uses also extend to spectrum analyzer and similar instrumentation. A significant advantage of the invention is the ability to place a passive, sensitive, temperature compensated detector in a harsh environment at the terminal end of a cable while obtaining sufficient signal integrity at the active electronic processing circuitry, located remotely from the harsh environment. This capability addresses not only passive detection of RF signals, but also power level and insertion loss measurements in sensors based on the propagation of RF, sonic, subsonic or ultrasonic signals in piezoelectric devices and other ultrasonic sensor devices.

BRIEF DESCRIPTION OF THE DRAWINGS

The invention will be better understood in view of he accompanying drawings in which.

DETAILED DESCRIPTION

Figure 4:
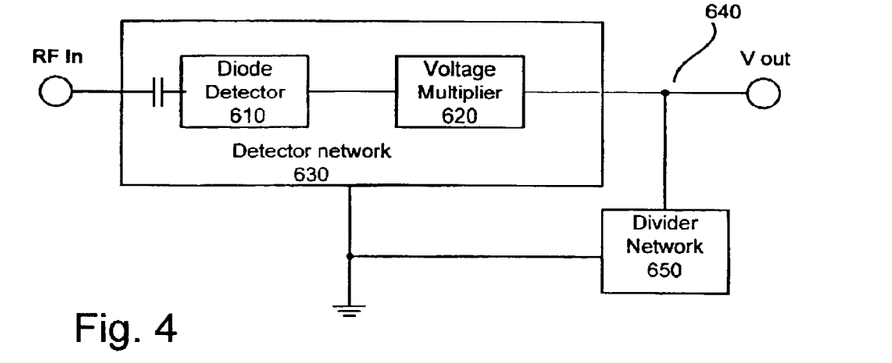
FIG. 4 depicts a simplified block diagram of a detector according to an aspect of the present invention.

Referring now to FIG. 4 a most basic embodiment of the invention is shown. An RF (or any frequency) signal is inputted via input terminal RFin, into detector network 630. Detector network 630 comprises at least two basic components—a diode detector 610 and a voltage multiplier 620. Those skilled in the art will recognize that the diode used in the diode detector 610 may be utilized as a part of the voltage multiplier 620, or the detector may be separate from the voltage multiplier. In the preferred embodiment the voltage multiplier is a voltage doubler, comprising of the detector diode and a multiplier diode, however any number of diodes may be used, to provide voltage multiplication of any factor.

Divider network 650 is coupled to the output of the detector network at junction 640, and as it is coupled to the circuit ground (equivalently referred to as ground in these specifications), it forms a voltage divider together with the detector network. The divider network contains the same number of diodes as used in the detector network. It can be seen that the same DC current passes through the divider and detector network, and that the divider network dynamic impedance, dictated primarily by the diodes, will equal the dynamic impedance of the detector network. As the detected signal is taken before the divider network, temperature compensation is achieved. Preferably, the voltage divider cuts the output voltage in (about) half, however as the detected voltage was doubled, the total output remains the same as that of a single diode. Higher order multipliers of order m offer detection efficiency increases of m/2.

Figure 5:
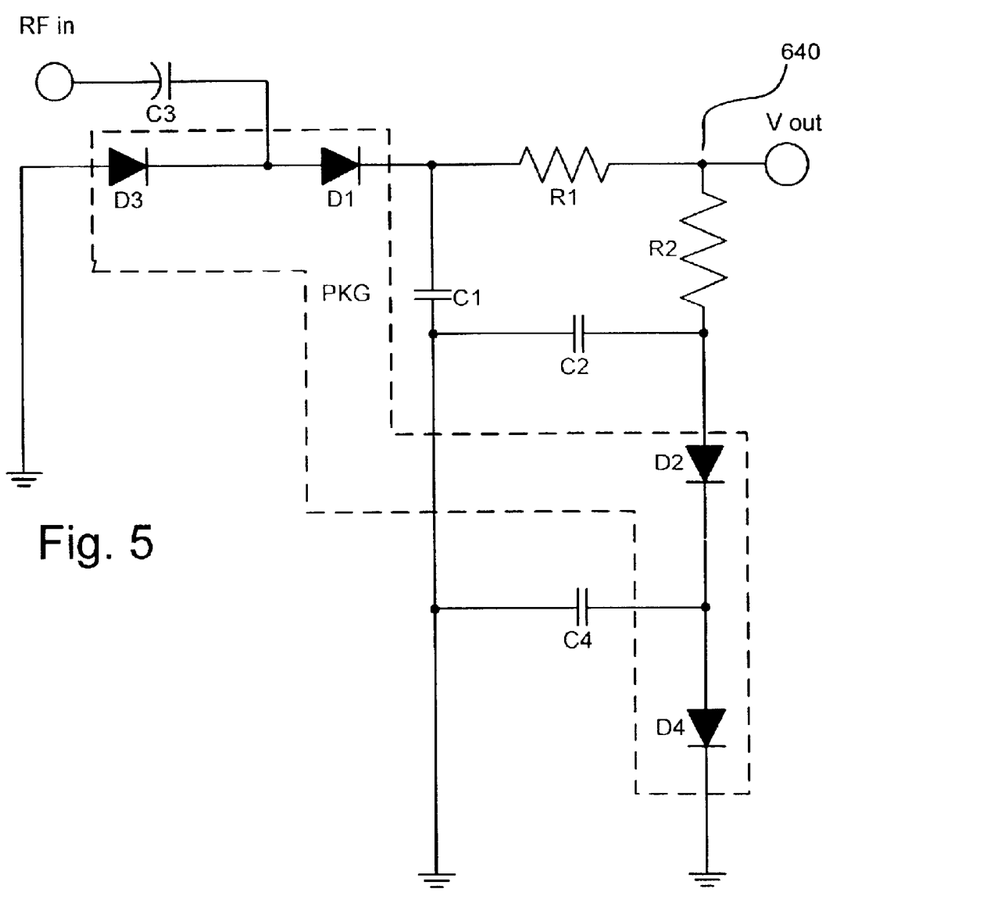
FIG. 5 depicts a basic diagram of a diode detector in accordance with the preferred embodiment of the present invention.

FIG. 5 shows a more detailed circuit example of the preferred embodiment of the invention. One terminal of capacitor C3 receives the signal to be decoded, and the other terminal is connected to the anode of diode D3 and the cathode of D1. The cathode of D3 is coupled to ground. The anode of D1 is connected to capacitor C1, which has its second terminal connected to ground. Optionally the anode of D1 is also coupled to one terminal of resistive element R1 which may be a resistor or a FET transistor. The other terminal of resistive element R1, or the anode of D1 if R1 is not used, is connected to the output terminal V out. Also coupled to V out is the divider network. If R1 is used it is highly desirable that the divider network will contain a resistive element as well R2 preferably being equal in value to R1. If so, one terminal of R2 is connected to the V out terminal and the other terminal is connected to two diodes connected in series, D2 and D4. The other terminal of the two series diodes is connected to ground. If R2 is not used, the two diodes are connected in series between the Vout terminal and ground.

As mentioned above, the polarities shown and described may be reversed, and the circuit will operate in a similar manner.

RF signal is inputted from the input terminal RFin, via capacitor C3 that is used both for DC blocking and as a part of the voltage doubler. The AC signal is connected to diodes D1 and D3 which form a full wave detector, which in conjunction with C1 and C3 double the detected voltage as compared to a single diode detector. The output of the detector/multiplier is connected via junction 640 to the output terminal Vout and to the divider network which comprise D2 and D4 which are connected in series to ground Capacitor C1 is acts as an integrating capacitor as well as provide RF return path and noise reduction. Capacitor C2 and capacitor C4 are used to shunt any remaining RF signal in the divider network. Resistors R1 and R2 provide additional stability and linearity of the output curve, and limit the power required by the circuit under optional biasing. It should be noted that the resistive elements might have different resistance but the preferred embodiment employs equal resistances. It should also be noted that only diodes D1, D2, D3 and D4, together with capacitors C1 and C3 are needed to achieve the desired circuit behavior. Thus only passive components (or components wired to act as such) are necessary to achieve the invention objective.

An analysis of the circuit shows that the same DC current will flow in D3, D1, R1, R2, D2 and D4, which form the current loop via ground. Therefore the dynamic impedance of all the diodes will be equal assuming the diodes are well matched. Thus the temperature effects of the diodes are mutually canceled. Additionally, the diodes may be forward biased as known to improve the detection range of the circuit. This can be achieved by many ways, one of which is shown schematically in FIG. 6 by battery B1. Other ways will include introducing a positive or negative voltage where appropriate, via a bias resistor, or other source as known. Since the impedance of the loop will be temperature dependent, the preferred embodiment would be a temperature compensated constant-current source.

The divider ratio is approximated by $$V\,det*(R2+m*Rdiode)/(R1+R2+2m*Rdiode)$$

where Vdet=detected voltage, m=number of series connected diodes in either the divider or detector networks, and Rdiode=dynamic resistance of a diode. Therefore R1=R2 will provide the best balanced detector circuit.

In order to expose all diodes to similar environment and in order to achieve maximum possible matching between the diodes it is desirable to place all the diodes in the circuit on the same substrate, or at least consist of diodes from adjacent locations from a common source wafer and isothermally located in the same package. It should also be noted that all components of the circuit may be embedded within a single integrated circuit.

Figure 6:
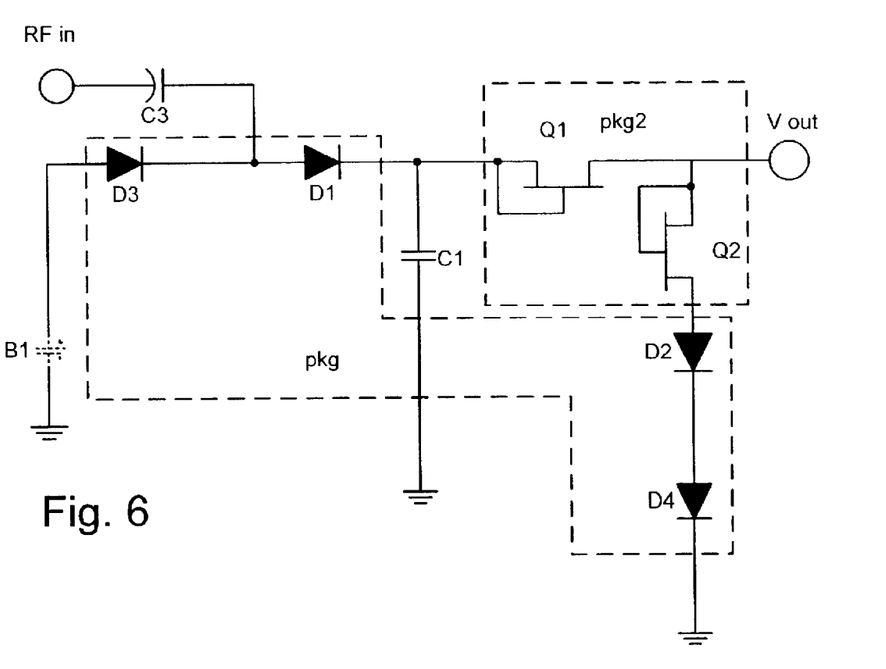
FIG. 6 represents yet another embodiment of the present invention.

FIG. 6 shows an embodiment that better fits for integration and embedding the circuit within an integrated circuit. As shown resistive elements R1 and R2 are replaced by FET transistors Q1 and Q2, with the gate and drain connected together. Those skilled in the art will recognize that the transistors Q1 and Q2 then will act as resistors, but will consume less space and simplify the integrated circuit design. While the drawing shows the packaging of the diodes D1, D2, D3, and D4 in a separate package PKG from FET transistors Q1 and 02 in package PKG2, it is desirable to have a single package to include as many of the circuit component as possible. Most preferably, the package is heat conducting such as a metal case.

Figure 7:
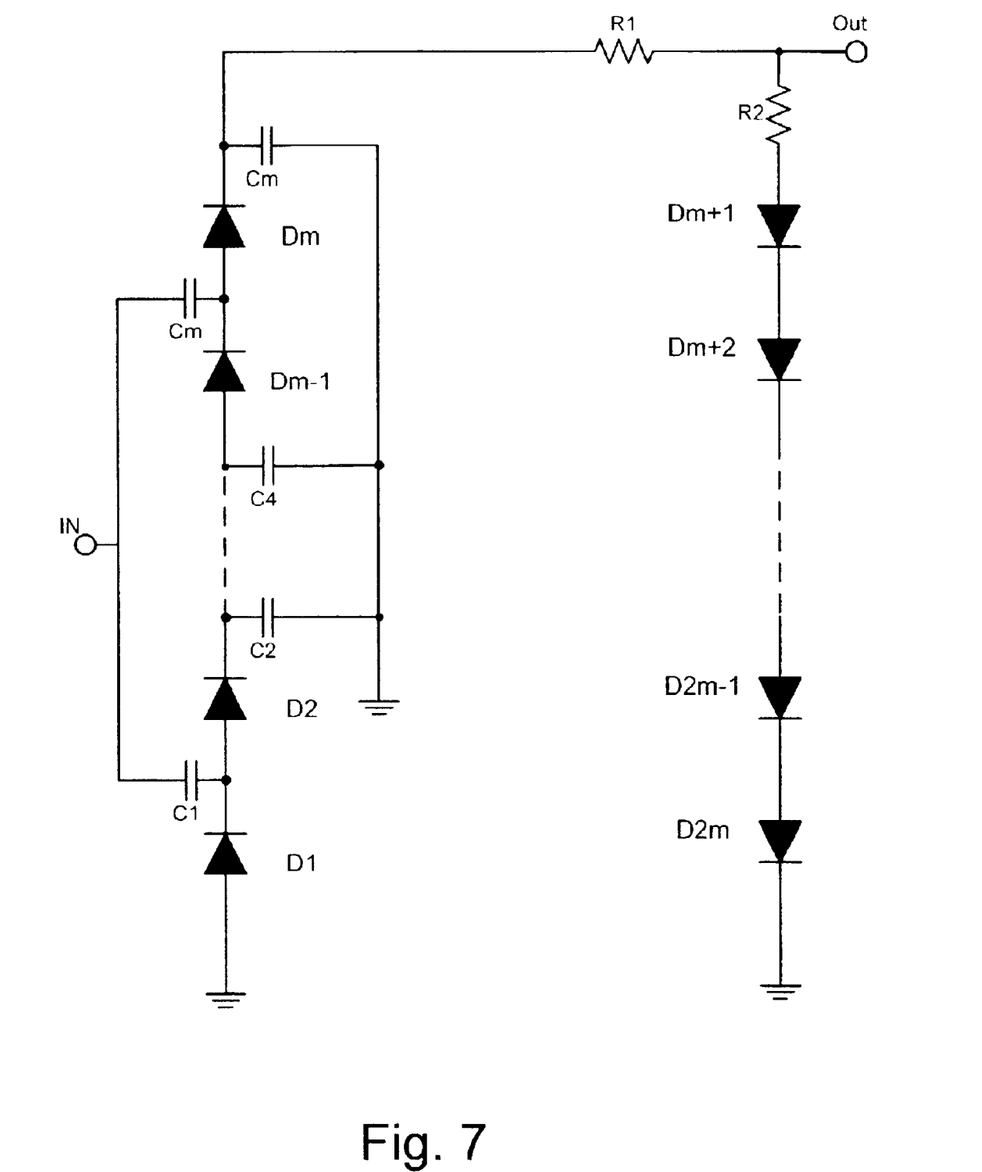
FIG. 7 depicts the general topology of an m-diode circuit (where m is even) having m/2 times the detection efficiency and 1/m the input impedance of a single diode detector while providing temperature compensation of the detected signal.

FIG. 7 shows a general embodiment of an $m^{th}$ order multiplier where m is even. A plurality of full wave rectifiers are placed in series and capacitively coupled to a common input signal via capacitors $C_1, \ldots C_m$, etc. The RF signal is returned to ground between each full wave rectifier segment by capacitors $C_2, \ldots C_m$, etc. The plurality of full wave rectifiers has a conversion factor m times larger than a single diode detector. Capacitor Cm performs the integrating function. Resistors R1 and R2 optionally control external and self biasing of the circuit. Diodes $D_{m+1}$ through $D_{2m}$ provide the temperature compensating divider leg. The related case in which m is odd may be implemented by replacing one full wave rectifier with a single diode detector segment and removing a corresponding diode from the divider branch of the circuit.

The uses of the present invention are many and varied. It may be deployed, inter alia, as general purpose envelope detector, and an RF power to voltage converter. The circuit is small, efficient, passive and offers stable compensated operation over a large temperature range. It provides special advantages in large number of devices ranging from bolometers, to cellular telephones. It can be used in automatic gain control (AGC) circuits, especially in digital radios. As common modulation methods of digital data require precise AGC, a stable small and efficient demodulator or power meter based on the detector described herein presents a significant advantage over the present state of the art. Any instrumentation that requires RF power measurements may also benefit from the unique characteristics present by a detector according to the present invention.

Most specifically, many piezoelectric sensors require measurements of input and/or output power, as the characteristics measured by the sensor directly effect the insertion loss or power transmission characteristics of the sensor. Oftentimes considerations of temperature range, power requirements space and cost require the use of an efficient detector. Therefore the invention further extend to detecting power in conjunction with a piezoelectric sensor. The invention is especially adaptable to piezoelectric sensors that measure the phase and power level shifts of an ultrasonic wave caused by a chemical or physical property of the surrounding environment. Piezoelectric sensors are favored in many applications due to their ability to operate in harsh physical and chemical environments, often exceeding the ability of active electronic components. While it is possible to place such sensors at the end of a cable and perform data analysis at the remote end of the cable from the harsh sensing environment, it is very advantageous that the power level measurements be made at the location of the piezoelectric sensor. The present invention addresses this specific need, by allowing a detector that is able to withstand and operate over wide temperature ranges in close proximity to the piezoelectric sensor while providing a robust, temperature-compensated, output signal that can be measured across a meaningful length of standard cable.

The skilled artisan will recognize that other components, both active and passive, may be added as desired to improve certain characteristics of the circuit such as dynamic range, signal to noise, and the like without detracting from the invention. Some clear alterations include incorporating electrical matching networks, biasing circuitry, active buffer amplifiers, and the like.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

What is claimed is:

1. A temperature compensated diode detector comprising:
    an input terminal adapted to receive an input signal, and an output terminal for outputting a detected voltage commensurating with said input signal;
    a detector network comprising:
        a detector diode, coupled to said input signal for producing a detected voltage,
        an integrating reactance coupled to said detector diode;
        a voltage multiplier circuit comprising at least one multiplier diode, said voltage multiplier coupled to said detected voltage for producing multiplied voltage thereof; and,
    a divider network comprising a plurality of diodes equaling in number to the number of diodes in said detector network, and coupled to said multiplier so as to divide the multiplied voltage by a pre-determined divider factor.

2. A temperature compensated diode detector as claimed in claim 1, wherein said detector diode is integrated within said voltage multiplier.

3. A temperature compensated diode detector as claimed in claim 1, wherein all diodes in the detector network are manufactured on a single substrate.

4. A temperature compensated diode detector as claimed in claim 1, wherein all diodes in divider network are manufactured on a single substrate.

5. A temperature compensated diode detector as claimed in claim 1, further comprising a first resistive element in said detector network and a second resistive element in said divider network.

6. A temperature compensated diode detector as claimed in claim 5, wherein the resistance of said first resistive element substantially equals the resistance of said second element.

7. A temperature compensated diode detector as claimed in claim 6, wherein said first resistive element and said second resistive each comprise a FET transistor.

8. A temperature compensated diode detector as claimed in claim 5, wherein said first and second resistive elements comprise a FET transistor.

9. A temperature compensated diode detector as claimed in claim 7, wherein said FET transistors and said diodes are integrated within one integrated circuit.

10. A temperature compensated diode detector as claimed in claim 8, wherein said FET transistors and said diodes are integrated within one integrated circuit.

11. A temperature compensated diode detector as claimed in claim 2, wherein said detector diode and voltage multiplier form a full wave voltage detector.

12. A temperature compensated diode detector as claimed in claim 1, wherein said detector network comprises:
    a multiplier diode having a circuit ground coupled cathode, and an anode;
    a detector diode having a cathode coupled to the anode of said multiplier diode, and having an anode;
    an integrating capacitor coupled between said anode of the detector diode and to circuit ground; and,
    an injecting capacitor coupled to the cathode of said detecting diode, and coupling an AC signal thereto.

13. A temperature compensated diode detector as claimed in claim 12, further comprising a resistive element coupled to said anode of the detector diode.

14. A temperature compensated diode detector as claimed in claim 12, wherein said divider network comprises two diodes connected in series, coupled between said anode of the detector diode, and circuit ground.

15. A temperature compensated diode detector as claimed in claim 14, further comprising a first and a second resistive elements coupled in series and forming a junction therebetween which is coupled to said output terminal, said first resistive element coupled to said anode of the detector diode and said second resistive element coupled to the cathode of the first of said two diodes connected in series.

16. A temperature compensated diode detector as claimed in claim 15, wherein said first and second resistive elements comprise FET transistors.

17. A temperature compensated diode detector as claimed in claim 16, wherein said diodes of the detecting network and said diodes of the divider network are formed on a single substrate.

18. A temperature compensated diode detector as claimed in claim 17, wherein said detecting network and said divider network are integrated within a single integrated circuit.

19. A temperature compensated diode detector as claimed in claim 15, wherein said diodes of the detecting network and said diodes of the divider network are formed on a single substrate.

20. A temperature compensated diode detector as claimed in claim 19, wherein said detecting network and said divider network are integrated within a single integrated circuit.

21. A temperature compensated diode detector as claimed in claim 14, wherein said diodes of the detecting network and said diodes of the divider network are formed on a single substrate.

22. A temperature compensated diode detector as claimed in claim 21, wherein said detecting network and said divider network are integrated within a single integrated circuit.

23. A temperature compensated diode detector as claimed in claim 13, wherein said diodes of the detecting network and said diodes of the divider network are formed on a single substrate.

24. A temperature compensated diode detector as claimed in claim 23, wherein said detecting network and said divider network are integrated within a single integrated circuit.

25. A temperature compensated diode detector as claimed in claim 12, wherein said diodes of the detecting network and said diodes of the divider network are formed on a single substrate.

26. A temperature compensated diode detector as claimed in claim 25, wherein said detecting network and said divider network are integrated within a single integrated circuit.

27. A temperature compensated diode detector as claimed in claim 1, wherein said diodes are forward biased by a direct current.

28. A temperature compensated diode detector as claimed in claim 1, wherein said divider factor is 2 or an approximation thereof.

29. A temperature compensated diode detector as claimed in claim 5, wherein said divider factor is 2 or an approximation thereof.

30. A temperature compensated diode detector as claimed in claim 12, wherein said divider factor is 2 or an approximation thereof.

31. A temperature compensated diode detector as claimed in claim 14, wherein said divider factor is 2 or an approximation thereof.

32. A temperature compensated diode detector as claimed in claim 27, wherein said divider factor is 2 or an approximation thereof.

33. A temperature compensated diode detector comprising a detector network and a divider network, each having an equal number of series coupled diodes therein, wherein the detector network is adapted to be coupled to an input signal and is operative to detect a voltage commensurating with said input signal and to multiply said detected voltage to produce a multiplied voltage; and wherein said divider network is coupled to said multiplied voltage and is operative to variably reduce said multiplied voltage in a temperature dependent manner.

34. A temperature compensated diode detector as claimed in claim 33 wherein the detector network and the divider network are coupled in series, and an output is taken from a junction therebetween.

35. A temperature compensated diode detector as claimed in claim 33 wherein said voltage multiplier multiplies said detected voltage by a predetermined factor, and wherein said divider divides said multiplied voltage by a divider factor of approximately 2.

36. A temperature compensated diode detector as claimed in claim 33, wherein said detector network and said divider network each has substantially equal temperature dependent dynamic impedance.

37. A temperature compensated diode detector as claimed in claim 33, wherein said detector network and said divider network are embedded within a single integrated circuit.

38. A temperature compensated diode detector as claimed in claim 33, wherein said diodes of the detecting network and said diodes of the divider network are formed on a single substrate.

39. A method for providing an output voltage commensurating with an alternating current input signal, the method comprising the steps of:
    coupling an input signal into a detector diode to produce detected voltage;
    multiplying said detected voltage using a voltage multiplier having at least one multiplier diode and an output voltage;
    dividing said output voltage by a divider network comprising a number of series coupled diodes equal to the sum of series coupled diodes used in said step of detecting and said step of multiplying.

40. A temperature compensated diode detector as claimed in claim 1, wherein said detector network comprises:
    a multiplier diode having a circuit ground coupled anode, and a cathode;
    a detector diode having an anode coupled to the cathode of said multiplier diode, and having a cathode;
    an integrating capacitor coupled between said cathode of the detector diode and to circuit ground; and,
    an injecting capacitor coupled to the anode of said detecting diode, and coupling an AC signal thereto.

41. A temperature compensated diode detector as claimed in claim 40, further comprising a resistive element coupled to said anode of the detector diode.

42. A temperature compensated diode detector as claimed in claim 40, wherein said divider network comprises two diodes connected in series, coupled between said cathode of the detector diode, and circuit ground.

43. A temperature compensated diode detector as claimed in claim 42, further comprising a first and a second resistive elements coupled in series and forming a junction therebetween which is coupled to said output terminal, said first resistive element coupled to said cathode of the detector diode and said second resistive element coupled to the anode of the first of said two diodes connected in series.

44. A temperature compensated diode detector as claimed in claim 43, wherein said first and second resistive elements comprise FET transistors.

45. A temperature compensated diode detector as claimed in claim 44, wherein said diodes of the detecting network and said diodes of the divider network are formed on a single substrate.

46. A temperature compensated diode detector as claimed in claim 44, wherein said detecting network and said divider network are integrated within a single integrated circuit.

47. A temperature compensated diode detector as claimed in claim 1, wherein said detector being employed to measure power levels in a piezoelectric sensor.

48. A temperature compensated diode detector as claimed in claim 5, wherein said detector being employed to measure power levels in a piezoelectric sensor.

49. A temperature compensated diode detector as claimed in claim 12, wherein said detector being employed to measure power levels in a piezoelectric sensor.

50. A temperature compensated diode detector as claimed in claim 14, wherein said detector being employed to measure power levels in a piezoelectric sensor.

51. A temperature compensated diode detector as claimed in claim 33, wherein said detector being employed to measure power levels in a piezoelectric sensor.

52. A temperature compensated diode detector comprising a detector network and a divider network, each having an equal number of series coupled diodes therein, wherein the detector network is adapted to be coupled to an input signal and is operative to detect a voltage commensurating with said input signal and to multiply said detected voltage to produce a multiplied voltage, and wherein said divider network is coupled to said multiplied voltage and is operative to reduce said multiplied voltage.

53. The temperature compensated diode detector of claim 52 wherein said divider network divides said multiplied voltage by a factor of 2 or an approximate thereof.

* * * * *